(12) United States Patent
Mori et al.

(10) Patent No.: US 6,430,102 B2
(45) Date of Patent: Aug. 6, 2002

(54) SEMICONDUCTOR INTEGRATED CIRCUIT AND METHOD FOR CONTROLLING ACTIVATION THEREOF

(75) Inventors: Kaoru Mori; Masato Matsumiya, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/859,259

(22) Filed: May 18, 2001

(30) Foreign Application Priority Data

Jun. 30, 2000 (JP) ........................................ 2000-198099

(51) Int. Cl.$^7$ ................................................. G11C 7/00

(52) U.S. Cl. ..................... 365/226; 365/225.7; 365/200

(58) Field of Search ................................ 365/200, 226, 365/189.09, 189.11, 227, 225.7

(56) References Cited

U.S. PATENT DOCUMENTS

| | | | | |
|---|---|---|---|---|
| 5,396,113 A | * | 3/1995 | Park et al. | ............. 365/189.09 |
| 6,108,246 A | * | 3/2000 | Umezawa et al. | .......... 365/226 |
| 6,185,129 B1 | * | 2/2001 | Seo | ............................. 365/226 |

* cited by examiner

Primary Examiner—Tan T. Nguyen
(74) Attorney, Agent, or Firm—Arent Fox Kintner Plotkin & Kahn, PLLC

(57) ABSTRACT

To supply a ground potential Vss to a starter signal level shifter and a fuse information latch circuit on the basis of a fuse starter signal of which low level is shifted from the ground potential Vss to a negative voltage Vnn by the starter signal level shifter until the fuse information is latched to the fuse information latch circuit. After the foregoing fuse information is latched, a finally attained potential is supplied to the starter signal level shifter and the fuse information latch circuit. Therefore, it is possible to latch without shifting the low level, so that it becomes possible to easily shift the low level from the ground potential Vss to the negative voltage Vnn after latching.

17 Claims, 8 Drawing Sheets

SEMICONDUCTOR INTEGRATED CIRCUIT AND METHOD FOR CONTROLLING ACTIVATION THEREOF

CROSS-REFERENCE TO RELATED APPLICATIONS

This application is based upon and claims priority of Japanese Patent Application No. 2000-198099, filed on Jun. 30, 2000, the contents being incorporated herein by reference.

BACKGROUND OF THE INVENTION

1. Field of the Invention

The present invention relates to semiconductor integrated circuits and methods for controlling activation thereof, in particular, suitable for use in a redundancy judgment circuit for determining redundancy of a redundant circuit upon activation.

2. Description of the Related Art

In order to lower electric power consumption, conventionally, an integrated circuit of a memory or the like has been required to lower the operational voltage. In recent years, for example, in a DRAM (Dynamic Random Access Memory), there is an integrated circuit that operates with an inner power supply voltage of about 2.0 V and a negative voltage of about −0.5 V.

A redundant circuit has been provided in the integrated circuit of a memory or the like in advance to remedy failure due to defect in the integrated circuit. In the case that failure has occurred in a portion of the circuit, the circuit that the failure occurs has been replaced with a redundant circuit to remedy the failure. In this integrated circuit provided with the redundant circuit, a fuse or the like to select whether the redundant circuit should be used or not is disposed and to replace the circuit, in which failure has occurred, with the redundant circuit is selected depending on whether the fuse or the like should be cut or not. In this case, when the integrated circuit is used in a normal operation, it is judged by a redundancy judgment circuit upon activation whether the integrated circuit lies in the condition of using the redundant circuit or not.

FIG. 1 is a diagram for showing a constitutional example of a redundancy judgment circuit, which is used in a conventional memory or the like.

In FIG. 1, a reference numeral 1 denotes a starter signal generation circuit for generating and outputting a starter signal STT in order to determine an initial state of a peripheral circuit. This starter signal STT rises together with a power supply voltage Vii when the power supply is turned on and it is reset at a low level when the potential of the power supply voltage Vii reaches a predetermined potential Vb.

A reference numeral 2' denotes a negative voltage generation circuit, which generates a negative voltage Vnn to be used in the integrated circuit including the redundancy judgment circuit. The negative voltage Vnn generated by the negative voltage generation circuit 2' is supplied to a starter signal level shifter 3, a fuse set pulse generation circuit 4 and a fuse information latch circuit 5 or the like.

The starter signal level shifter 3 shifts a low level of the starter signal STT, which is supplied from the starter signal generation circuit 1, from a ground potential Vss to a potential of the negative voltage Vnn. The starter signal level shifter 3 supplies a signal, which shows that the low level is shifted to the potential of the negative voltage Vnn, to the fuse set pulse generation circuit 4 and the fuse information latch circuit 5 as a fuse starter signal STTB.

The fuse set pulse generation circuit 4 comprises a circuit for generating a fuse set pulse signal FSETP to judge the redundancy on the basis of the supplied fuse starter signal STTB. Then, the fuse set pulse generation circuit 4 supplies the generated fuse set pulse signal FSETP to the fuse information latch circuit 5.

The fuse information latch circuit 5 is provided with a fuse to select whether the redundant circuit should be used or not. The fuse information latch circuit 5 judges upon activation whether the fuse is cut or not and stores this judgment result therein. That is, the fuse information latch circuit 5 uses the generated fuse set pulse signal FSETP, which is supplied from the fuse set pulse generation circuit 4, to judge upon activation whether the current fuse is cut or not and store this judgment result therein. The fuse information latch circuit 5 outputs the above judgment result through an output node 6 as an output signal FSZ.

The low level of each of the fuse set pulse signal FSETP and the output signal FSZ respectively output from the above described fuse set pulse generation circuit 4 and the above described fuse information latch circuit 5 is equal to the potential of the negative voltage Vnn.

FIG. 2 is a diagram for showing a configuration of a conventional negative voltage generation circuit 2'.

In FIG. 2, a reference numeral 31 denotes a negative voltage judgment circuit. The negative voltage judgment circuit 31 judges whether the potential of the negative voltage Vnn to be output through an output node 34 of the negative voltage generation circuit 2' is lowered to a predetermined potential or not. Additionally, the negative voltage judgment circuit 31 outputs the judgment result to a negative voltage generation enable circuit 32.

The negative voltage generation enable circuit 32 outputs an enable signal EN for controlling a negative voltage generation operation. This enable signal EN is generated on the basis of the judgment result to be supplied from the negative voltage judgment circuit 31 and a memory bank activation signal BRAS to be input through an input node 35. Additionally, the memory bank activation signal BRAS comprises a signal such that 'H' is output upon activating the memory bank. However, it is clamped in 'L' by a not-shown circuit upon activation. Therefore, the negative voltage generation enable circuit 32 outputs the enable signal EN only on the basis of the judgment result to be supplied from the negative voltage judgment circuit 31 upon activation.

A reference numeral 33 denotes an oscillation and pumping circuit. The oscillation and pumping circuit 33 generates the negative voltage Vnn and outputs it through the output node 34 in accordance with the enable signal EN to be supplied from the negative voltage generation enable circuit 32. The oscillation and pumping circuit 33 shown in FIG. 2 performs the negative voltage generation operation when the enable signal EN is 'H' and it does not perform the negative voltage generation operation when the enable signal EN is 'L'.

FIG. 3 is a timing chart for explaining the operation of a conventional redundancy judgment circuit.

In FIG. 3, the power supply voltage Vii rises up when the power supply is turned on at a time of $T_{10}$. As the power supply voltage Vii rises up, the enable signal EN, the starter signal STT, the fuse starter signal STTB, the fuse set pulse signal FSETP and the output signal FSZ also rise up.

When the potential of the power supply voltage Vii reaches a predetermined potential Va at a time of $T_{11}$, the oscillation and pumping circuit 33 in the negative voltage generation circuit 2' detects that the enable signal EN is 'H'. This allows the negative voltage generation operation to be started by the oscillation and pumping circuit 33 and the potential of the negative voltage Vnn to be output from the negative voltage generation circuit 2' is lowered. Then, the oscillation and pumping circuit 33 continues the negative voltage generation operation until a time of $T_{12}$, when the potential of the negative voltage Vnn reaches a predetermined potential.

When the negative voltage judgment circuit 31 judges that the potential of the negative voltage Vnn reaches a predetermined potential at a time of $T_{12}$, the negative voltage judgment circuit 31 outputs this judgment result to the negative voltage generation enable circuit 32. Depending on this judgment result, the negative voltage generation enable circuit 32 makes the enable signal EN at 'L'. Thus, the negative voltage generation operation of the oscillation and pumping circuit 33 is not performed and the negative voltage Vnn to be output from the negative voltage generation circuit 2' becomes a predetermined voltage.

Further, as the power supply voltage Vii rises up and the power supply voltage Vii reaches a predetermined potential Vb at a time of $T_{13}$, the, starter signal STT is reset to 'L'. In accordance with this, the fuse starter signal STTB to be output from the starter signal level shifter 3 becomes 'L'. Thus, the fuse set pulse signal FSETP is generated by the fuse set pulse generation circuit 4.

Then, this fuse set pulse signal FSETP is supplied to the fuse information latch circuit 5 and the redundancy of the redundant circuit is judged, so that the judgment result is latched. After this, the fuse information latch circuit 5 continues to hold the judgment result. As a result of the judgment of the redundancy, the fuse information latch circuit 5 makes the output signal FSZ at 'L' in the case that the redundant circuit is not redundant, namely, the redundant circuit is used and it keeps the output signal FSZ in 'H' in the case that the redundant circuit is redundant.

The potential of the power supply voltage Vii becomes constant at a time of $T_{14}$. After that, if the potential of the negative voltage Vnn is higher than a predetermined potential, for example, at a time of $T_{15}$, it is judged by the negative voltage judgment circuit 31 that the potential of the negative voltage Vnn is higher than a predetermined potential. Then, this judgment result is input in the negative voltage generation enable circuit 32 and the enable signal EN to be output from the negative voltage generation enable circuit 32 becomes 'H'. Thus, the negative voltage generation operation is commences again by the oscillation and pumping circuit 33.

In this case, if the potential of the negative voltage Vnn is lower than a predetermined potential at a time of $T_{16}$, it is judged by the negative voltage judgment circuit 31 that the potential of the negative voltage Vnn is lower than a predetermined potential. In accordance with this, the negative voltage generation enable circuit 32 makes the enable signal EN at 'L'. Thus, the oscillation and pumping circuit 33 does not perform the negative voltage generation operation and the potential of the negative voltage Vnn becomes constant.

As described above, the redundancy judgment circuit shown in FIG. 1 performs the redundancy judgment of the redundant circuit.

The low level of the fuse starter signal STTB to be supplied to the fuse information latch circuit 5 is defined as a potential of a negative voltage Vnn in the redundancy judgment circuit shown in FIG. 1. This intends to prevent a feedthrough current from being generated in the redundant circuit after resetting (at and after the time of $T_{13}$ in FIG. 3) in the case that the above described redundancy judgment circuit is used as a redundancy judgment circuit of a word line of a memory or the like. That is, if the low level of the fuse starter signal STTB is not defined as a potential of a negative voltage Vnn but defined as a ground potential Vss, the feedthrough current may be generated after resetting, since the low level of the fuse starter signal STTB is higher than the negative voltage Vnn as a reset voltage of the word line.

Thus, the redundancy judgment circuit shown in FIG. 1 shifts the low level of the starter signal STT (a ground potential Vss) to the potential of the negative voltage Vnn by the starter signal level shifter 3. Then, the redundancy judgment circuit outputs the shifted low level as the fuse starter signal STTB.

However, in associated with lowering of the voltage of the power supply, the voltage of the power supply and the operational voltage of the integrated circuit are not always capable of being lowered at the same ratio. For example, it is not possible to lower the negative voltage in a reset potential of a word line of a memory or the like at the same ratio as that of the power supply in order to control leakage upon standby. In this case, the high level is relatively lowered. Therefore, in the case that the signal is changed from the high level to the low level or the like, it becomes difficult to shift the low level from the ground potential to the negative potential.

In order to solve this problem, there is a method to adjust size of a transistor so that the level shift becomes easy in the case that the level shifter for level shift is configured of a transistor.

However, according to the method to adjust the size of the transistor, there is a limitation in the range capable of being made smaller in the case of decreasing the size of the transistor. Therefore, this involves such a problem that other transistors should be made larger. Further, in the case that the voltage of the power supply is lowered, so that, for example, the voltage of the power supply becomes 0.8 V and the negative voltage becomes about –0.5 V, there is such a problem that the level shift is difficult only by adjusting the size of the transistor.

Besides, in the case that a noise is loaded on a signal to be input in the level shifter, the conventional level shifter involves such a problem that it faithfully level-shifts and outputs the signal which is loaded with the noise.

SUMMARY OF THE INVENTION

The present invention has been made taking the foregoing problems into consideration, an object of which is to enable to easily shift the low level without increasing the size of the transistor even when the voltage of the power supply is lowered.

Additionally, the second object of the present invention is to make a noise difficult to be transmitted to an output signal even when the signal loaded with the noise is input and make the signal strong to the noise.

A semiconductor integrated circuit according to the present invention is characterized in that the semiconductor integrated circuit comprises a voltage generation circuit, which rises up together with a power supply voltage to be supplied after a power supply is turned on, does not perform a voltage generation operation before the predetermined information is latched by a latch circuit on the basis of an input signal, which becomes a low level when the power supply voltage reaches a predetermined potential or its complementary signal and performs the voltage generation operation after the predetermined information is latched by the latch circuit.

Further, a semiconductor integrated circuit according to the present invention is characterized in that the semiconductor integrated circuit comprises a voltage generation circuit described as below. That is, on the basis of an input signal, of which level is shifted from a first potential to a second potential which is lower than the first potential, the voltage generation circuit generates higher potential than a finally attained potential as a second potential before the predetermined information is latched by the latch circuit, and generates the finally attained potential as the second potential after the predetermined information is latched by the latch circuit.

Additionally, a method for controlling activation according to the present invention is. characterized in that the method comprises supplying a potential, which is not more than a ground potential and is higher than the finally attained potential, to the latch circuit as a negative potential and shifting a low level of an input signal to be input from the ground potential to the negative potential to output it and supplying the finally attained potential as the negative potential after the predetermined information is latched to the latch circuit on the basis of the output signal.

According to the present invention constituted as described above, the predetermined information is latched to a latch circuit on the basis of the input signal, of which low level is shifted from a first potential to a potential that is higher than a potential to which the low level will be finally reach. Then, after the latch circuit latches the predetermined information, the low level is made into a finally attained potential. That is, the low level has been shifted to a potential that is higher than a finally attained potential until the predetermined information is latched to the latch circuit. Thus, the potential difference to be shifted is smaller compared with a case that the low level is shifted to the finally attained potential. Since the low levels of the level shift circuit and the latch circuit become the finally attained potential after that, it becomes easy to shift the low level without increasing the size of the transistor even when the power supply voltage is lowered.

Besides, the low level has been shifted to a potential that is higher than a finally attained potential until the predetermined information is latched to the latch circuit. After the predetermined information is latched to the latch circuit, a voltage generated by the voltage generation circuit is supplied and the low level becomes the finally attained potential. On this account, after the predetermined information is latched to the latch circuit, it becomes difficult to invert a signal, so that a noise is hardly transmitted to an input signal even when the noise is loaded on the input signal and the predetermined information in the latch circuit is made strong to disturbance.

DETAILED DESCRIPTION OF THE PREFERRED EMBODIMENTS

An embodiment according to the present invention will be explained with reference to the drawings below.

Figure 1:
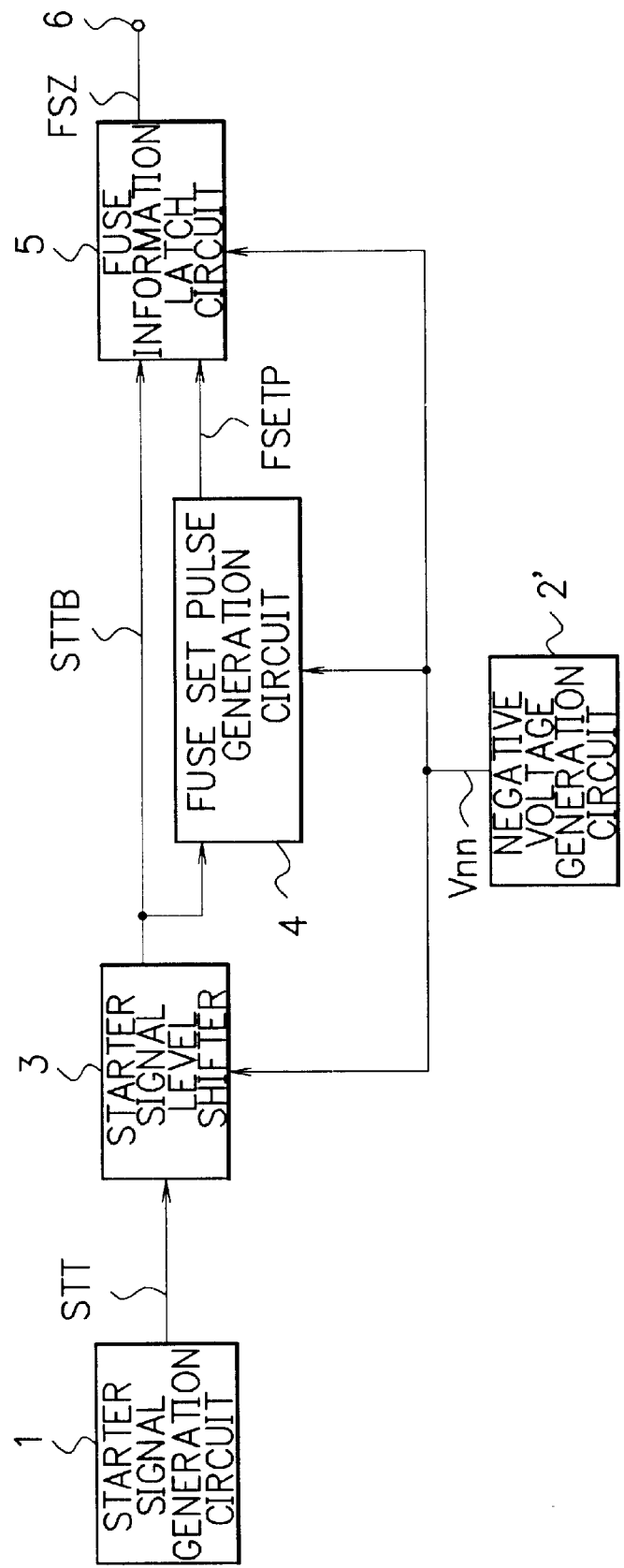
FIG. 1 is a block diagram for showing a constitutional example of a conventional redundancy judgment circuit.
Figure 2:
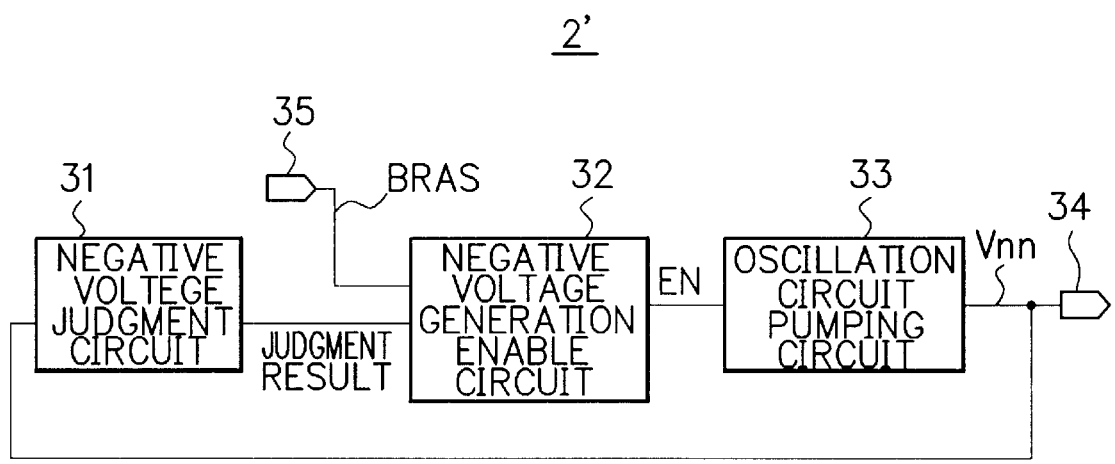
FIG. 2 is a block diagram for showing a constitution of a conventional negative voltage generation circuit.
Figure 3:
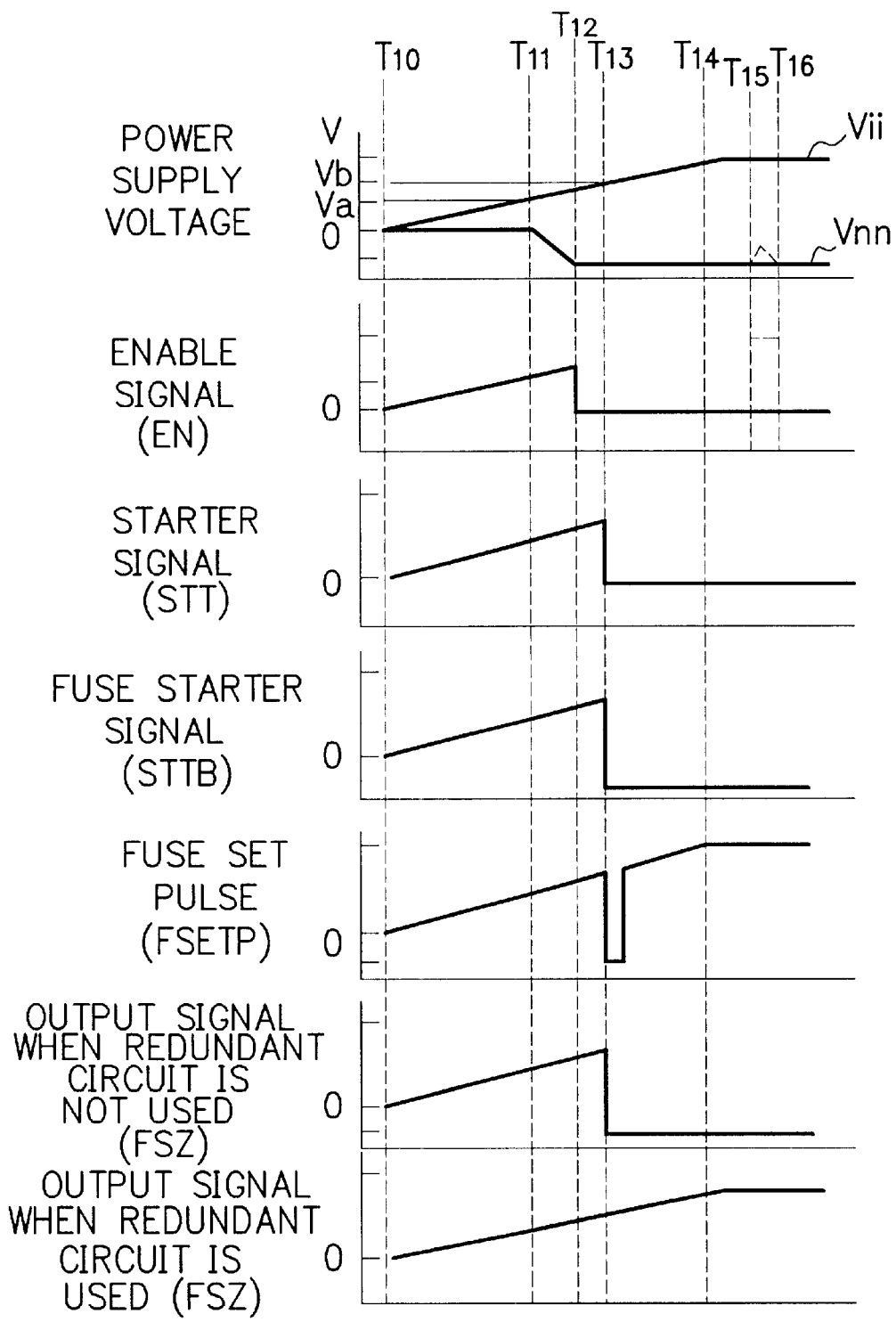
FIG. 3 is a timing chart for showing an operation of a conventional redundancy judgment circuit.
Figure 4:
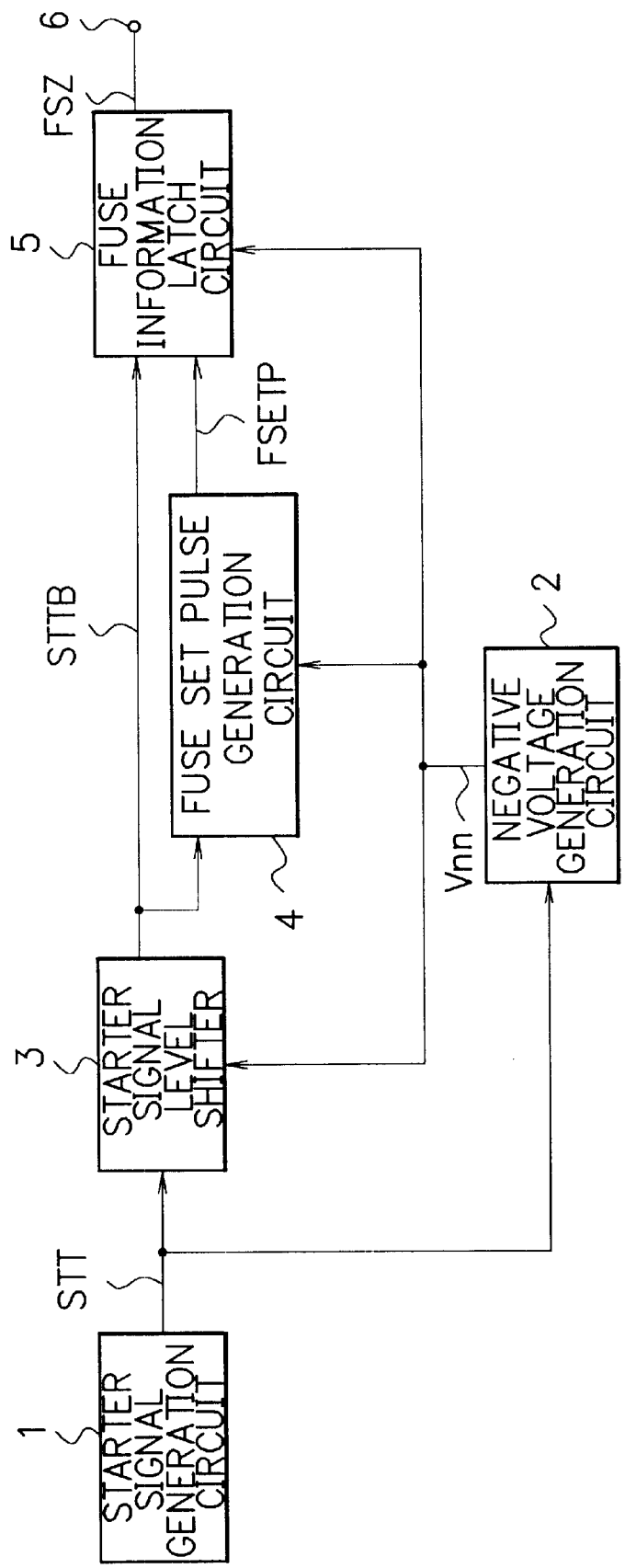
FIG. 4 is a block diagram for showing a constitutional example of a redundancy judgment circuit, which applies a semiconductor integrated circuit according to the first embodiment of the present invention.

FIG. 4 is a block diagram for showing a constitutional example of a redundancy judgment circuit of a word line of a memory or the like, which applies a semiconductor integrated circuit according to the first embodiment of the present invention.

In FIG. 4, a reference numeral 1 denotes a starter signal generation circuit. The starter signal generation circuit 1 comprises a circuit for generating and outputting a starter signal STT to determine an initial state of a peripheral circuit. When the power supply is turned on, this starter signal STT rises up together with a power supply voltage Vii. When a potential of a power supply voltage Vii reaches a predetermined potential Vb, this starter signal STT is reset to a low level.

In FIG. 4, a reference numeral 2 denotes a negative voltage generation circuit. The negative voltage generation circuit 2 is a circuit for generating and outputting a negative voltage Vnn to be used in an integrated circuit including the redundancy judgment circuit. In this negative voltage generation circuit 2, the starter signal STT generated by the above described starter signal generation circuit 1 is input. The negative voltage generation circuit 2 does not perform the negative voltage generation operation upon activation until the starter signal STT is reset and outputs a potential between a finally attained potential and a ground potential Vss or a ground potential Vss as a potential of the negative voltage Vnn.

The negative voltage Vnn to be generated by the negative voltage generation circuit 2 is supplied to a starter signal level shifter 3, a fuse set pulse generation circuit 4 and a fuse information latch circuit 5 or the like.

The starter signal level shifter 3 shifts the low level of the starter signal STT to be supplied from the starter signal generation circuit 1 from the ground potential Vss to the potential of the negative voltage Vnn. Additionally, the starter signal level shifter 3 supplies a signal provided in such a manner that the low level is shifted to the potential of the negative voltage Vnn to the fuse set pulse generation circuit 4 and the fuse information latch circuit 5 as a fuse starter signal STTB.

The fuse set pulse generation circuit 4 comprises a circuit for generating a fuse set pulse signal FSETP to perform redundancy judgment on the basis of the supplied fuse starter signal STTB. That is, the fuse set pulse generation circuit 4 generates the fuse set pulse signal FSETP, which becomes 'L' only at a predetermined period when the fuse starter signal STTB changes from 'H' to 'L'. Then, the fuse set pulse generation circuit 4 supplies the generated fuse set pulse signal FSETP to the fuse information latch circuit 5.

The fuse information latch circuit 5 is provided with a fuse to select whether the redundant circuit should be used or not. The fuse information latch circuit 5 judges upon activation whether the fuse is cut or not and stores this judgment result therein. That is, the fuse information latch circuit 5 uses the generated fuse set pulse signal FSETP, which is supplied from the fuse set pulse generation circuit 4, to judge upon activation whether the fuse is cut or not and store this judgment result therein.

The fuse information latch circuit 5 outputs the above judgment result through an output node 6 as an output signal FSZ. The fuse information latch circuit 5 makes the output signal FSZ in 'H' in the case that the fuse is cut (when the redundant circuit is used) and makes the output signal FSZ in 'L' in the case that the fuse is not cut (when the redundant circuit is not used).

Next, a circuit constitution of a redundancy judgment circuit according to the first embodiment shown in FIG. 4 will be explained for each block below.

In the following explanation, a P channel transistor is referred to as "Pch-Tr" and an N channel transistor is referred to as "Nch-Tr ".

Figure 5:
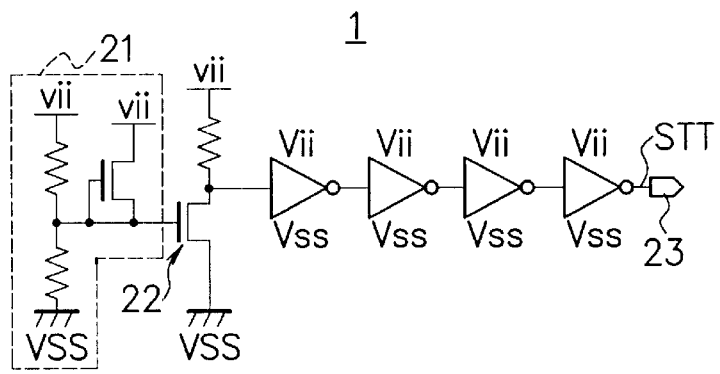
FIG. 5 is a circuit diagram for showing a circuit constitutional example of a starter signal generation circuit 1.

FIG. 5 is a diagram for showing a circuit constitutional example of a starter signal generation circuit 1.

In FIG. 5, a circuit 21 comprises a circuit for supplying a gate voltage to the Nch-Tr22 and it is configured by two resistors and one Nch-Tr. The two resistors are connected between the power supply voltage Vii and the ground potential Vss in series. The Nch-Tr is connected to the above intermediate node and it supplies the voltage to the gate of the Nch-Tr22.

The drain of the Nch-Tr22 is connected to the power supply voltage Vii via an input node of a first stage in four inverters, which are connected in series and a resistor. Additionally, an output node in the fourth stage of the four inverters, which are connected in series, is connected to an output node 23, which intends to output the starter signal STT.

Thus, as the power supply voltage Vii rises up upon activation, the potential to be supplied from the circuit 21 to the gate of the Nch-Tr22 becomes higher. Consequently, a current driving capability of the Nch-Tr22 is increased. However, since the current driving capability of the Nch-Tr22 is not sufficient until the potential of the power supply voltage Vii reaches a predetermined potential Vb, the input node of the first stage in the inverters becomes 'H' and the signal to be output from the fourth stage in the inverters becomes 'H'. That is, the starter signal STT to be output through the output node 23 becomes 'H'.

Then, when the potential of the power supply voltage Vii reaches a predetermined potential Vb, the current driving capability of the Nch-Tr22 is sufficiently increased, so that it becomes possible to make the input node of the first stage of the inverters 'L'. Thus, the signal to be output from the fourth stage of the inverters becomes 'L' and the starter signal STT to be output through the output node 23 also becomes 'L'.

Figure 6:
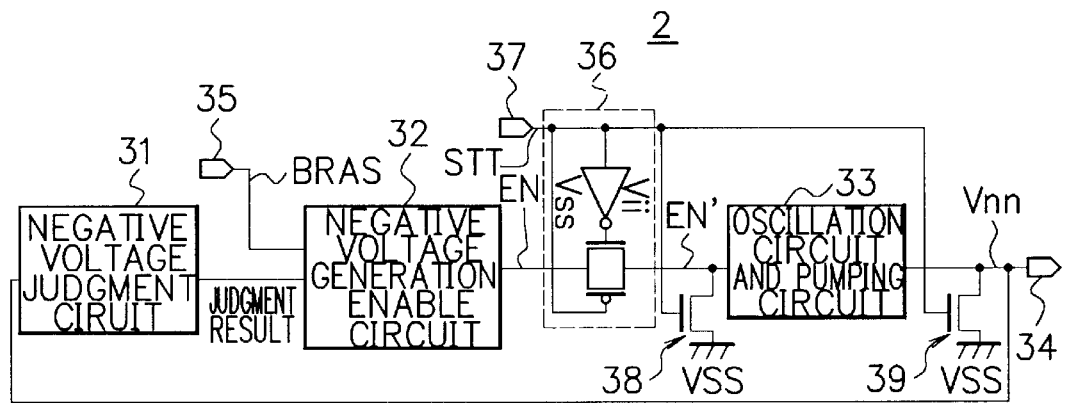
FIG. 6 is a diagram for showing a circuit constitutional example of a second negative voltage generation circuit 2.

FIG. 6 is a diagram for showing a circuit constitutional example of a negative voltage generation circuit 2.

In FIG. 6, a reference numeral 31 denotes a negative voltage judgment circuit. The negative voltage judgment circuit 31 judges whether the potential of the negative voltage Vnn, which is generated by the oscillation and pumping circuit 33 and is output through an output node 34, is lowered to a predetermined potential or not. As a result of the judgment, if the potential of the negative voltage Vnn is lowered to a predetermined potential, the negative voltage judgment circuit 31 outputs 'L' to a negative voltage generation enable circuit 32 and if the potential of the negative voltage Vnn is not lowered to a predetermined potential, the negative voltage judgment circuit 31 outputs 'H' to a negative voltage generation enable circuit 32.

The negative voltage generation enable circuit 32 generates and outputs the enable signal EN to control the negative voltage generation operation. This enable signal EN is generated on the basis of the judgment result to be supplied from the negative voltage judgment circuit 31 and a memory bank activation signal BRAS to be input through an input node 35.

The negative voltage generation enable circuit 32 outputs 'H' as the enable signal EN, when at least one of the above judgment result and the above memory bank activation signal BRAS is 'H'. When both of the above judgment result and the above memory bank activation signal BRAS are 'L', the negative voltage generation enable circuit 32 outputs 'L' as the enable signal EN. The above memory bank activation signal BRAS comprises a signal such that 'H' is output upon activating the memory bank. However, it is clamped in 'L' by a not-shown circuit upon activation.

The oscillation and pumping circuit 33 generates the negative voltage Vnn in accordance with the enable signal EN' to be output and supplied from a switching circuit 36 and outputs it through the output node 34. When the enable signal EN' becomes 'H', the oscillation and pumping circuit 33 performs the negative voltage generation operation and when the enable signal EN' becomes 'L', the oscillation and pumping circuit 33 does not perform the negative voltage generation operation.

A reference numeral 36 denotes a switching circuit. The switching circuit 36 switches whether the enable signal to be supplied from the negative voltage generation enable circuit 32 is output to the oscillation and pumping circuit 33 or not. The switching circuit 36 is configured by one Pch-Tr, one Nch-Tr and one inverter and the above Pch-Tr and the above Nch-Tr configure a transfer gate. In the above Nch-Tr, a signal such that the starter signal STT to be input through an input node 37 is inverted by the above inverter is input. In the above Pch-Tcr, the starter signal STT to be input through the input node 37 is input as it is.

Therefore, the switching circuit 36 outputs the enable signal EN to be supplied to the oscillation and pumping circuit 33 as the enable signal EN' when the starter signal STT to be input through the input node 37 is 'L'. On the other hand, when the starter signal STT to be input through the input node 37 is 'H', the switching circuit 36 does not output the enable signal EN to be supplied to the oscillation and pumping circuit 33.

Thus, in a negative voltage generation circuit 2 shown in FIG. 6, the oscillation and pumping circuit 33 does not perform the negative voltage generation operation before resetting. Then, only when 'H' is output as the enable signal EN after resetting, the oscillation and pumping circuit 33 performs the negative voltage generation operation.

A reference numeral 38 denotes a Nch-Tr to clamp the input of the oscillation and pumping circuit 33 to the ground potential Vss and a reference numeral 39 denotes a Nch-Tr to clamp the output node 34 for outputting the negative voltage Vnn to the ground potential Vss. When the enable signal EN' is not supplied from the switching circuit 36, the Nch-Tr 38 prevents the input in the oscillation and pumping circuit 33 from being floated. Additionally, the Nch-Tr 39 prevents the potential of the output node 34 from being a positive potential and a negative potential by a coupling capacity with respect to an other not-shown power supply. For example, the Nch-Tr 39 prevents latch-up to be generated when the potential of the output node 34 becomes a positive potential.

Figure 7:
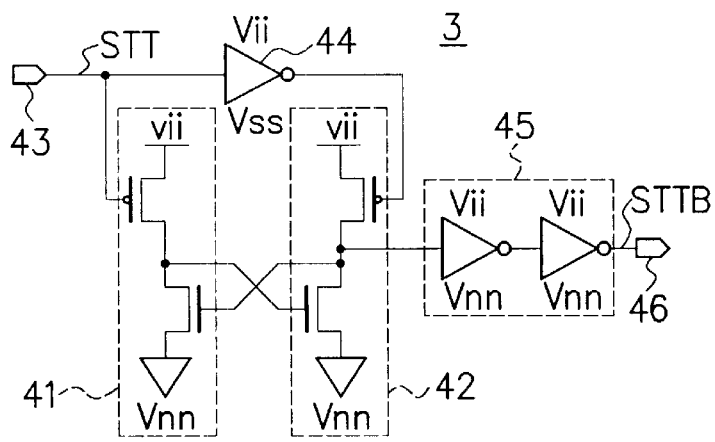
FIG. 7 is a diagram for showing a circuit constitutional example of a starter level shifter 3.

FIG. 7 is a diagram for showing a circuit constitutional example of a starter signal level shifter 3.

In FIG. 7, reference numerals 41 and 42 denote circuits, in which one Pch-Tr and one Nch-Tr are connected between the power supply voltage Vii and the negative voltage Vnn in series, respectively. In these circuits 41 and 42, the Pch-Tr is connected to the power supply voltage Vii and the Nch-Tr is connected to the negative voltage Vnn.

Additionally, the starter signal STT to be input through the input node 43 is input in the Pch-Tr in the circuit 41 and the signal such that the present starter signal STT is inverted by the inverter 44 is input in the Pch-Tr in the circuit 42. The output of the circuit 42 is input in the Nch-Tr of the circuit 41 and the output of the circuit 41 is input in the Nch-Tr of the circuit 42.

The output of the circuit 42 is input in a circuit 45, which is connected to two inverters in series. Then, the output of the circuit 42 is output through the output node 46 for outputting the fuse starter signal STTB.

As a result, if the starter signal STT to be input through the input node 43 is 'H' (Vii), the Pch-Tr of the circuit 41 is turned off. Additionally, the Pch-Tr of the circuit 42 is turned on and the Nch-Tr of the circuit 41 is turned on and the Nch-Tr of the circuit 42 is turned off. Consequently, the output of the circuit 42 becomes 'H' (Vii) and the fuse starter signal STTB to be output through the circuit 45 and the output node 46 becomes 'H' (Vii).

On the other hand, in the case that the starter signal STT to be input through the input node 43 is 'L' (Vss), the Pch-Tr of the circuit 41 is turned on. Additionally, the Pch-Tr of the circuit 42 is turned off and the Nch-Tr of the circuit 42 is turned on and the Nch-Tr of the circuit 41 is turned off. Consequently, the output of the circuit 42 becomes 'L' (Vnn) and the fuse starter signal STTB to be output through the circuit 45 and the output node 46 becomes 'L' (Vnn).

Figure 8:
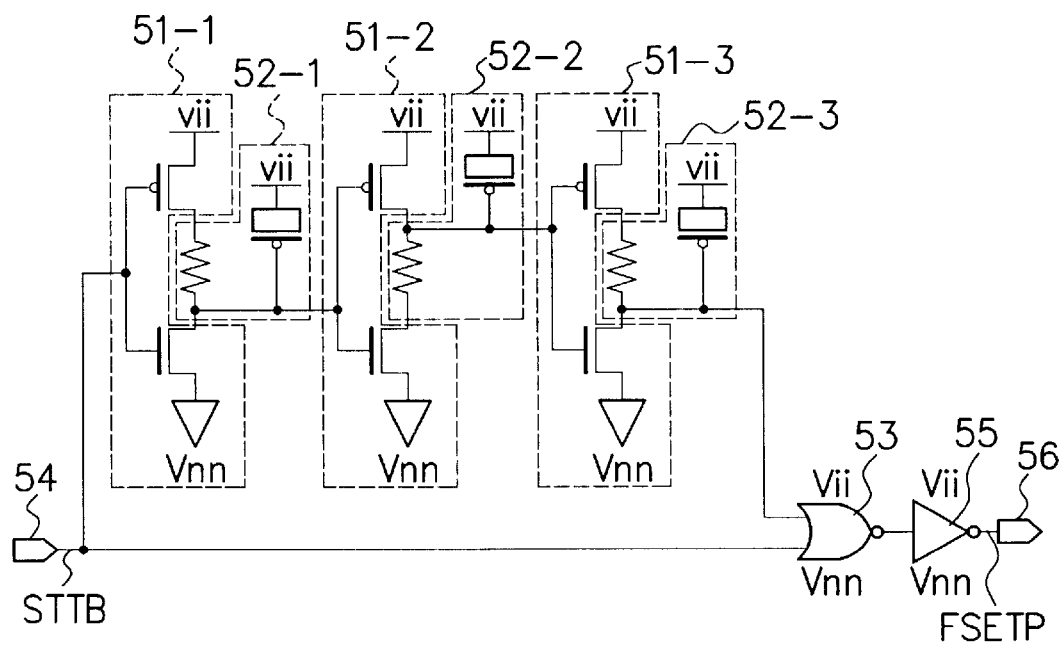
FIG. 8 is a diagram for showing a circuit constitutional example of a fuse set pulse generation circuit 4.

FIG. 8 is a diagram for showing a circuit constitutional example of a fuse set pulse generation circuit 4.

In FIG. 8, reference numerals 51-1, 51-2 and 51-3 denote inverters, which are configured by one Pch-Tr connected to a power supply voltage Vii side and one Nch-Tr connected to a negative voltage Vnn side, respectively. Reference numerals 52-1, 52-2 and 52-3 denote delay lines, which are configured by resistors and transistors, respectively. The transistors configuring the delay lines 52-1 to 52-3 function as capacitors.

A reference numeral 53 denotes a NOR circuit. In the NOR circuit 53, the fuse starter signal STTB to be input through an input node 54, and a signal such that the present fuse starter signal STTB is inverted and delayed by the above inverters 51-1 to 51-3 and delay lines 52-1 to 52-3 are input. A reference numeral 55 denotes an inverter. The inverter 55 inverts the output of the NOR circuit 53 and outputs it to an output node 56 to output the fuse set pulse signal FSETP.

As a result, a signal to be output through the above inverters 51-1 to 51-3 and the above delay lines 52-1 to 52-3 becomes 'L' when the fuse starter signal STTB to be input through the input node 54 becomes 'H' and a sufficient time has past. Therefore, 'H' is input to one input of the NOR circuit 53 and 'L' is input to other input of the NOR circuit 53, so that a signal to be output through an output node 56 becomes 'H'.

Then, in the case that the fuse starter signal STTB is changed from 'H' to 'L' and a total delay time (DT) has not passed in the above inverters 51-1 to 51-3 and the above delay lines 52-1 to 52-3, signals to be output through the above delay lines 52-1 to 52-3 remain 'L'. In this case, 'L' is input to one input of the NOR circuit 53 and 'L' is input to other input of the NOR circuit 53. Accordingly, a signal to be output through an output node 56 becomes 'L'.

Further, in the case that the fuse starter signal STTB is changed from 'H' to 'L' and the total delay time (DT) has passed, signals to be output through the above inverters 51-1 to 51-3 and the above delay lines 52-1 to 52-3 becomes 'H'. Consequently, 'L' is input to one input of the NOR circuit 53 and 'H' is input to other input of the NOR circuit 53, so that a signal to be output through an output node 56 becomes 'H'.

As described above, when the fuse starter signal STTB is changed from 'H' to 'L', the fuse set pulse generation circuit 4 generates the fuse set pulse signal FSETP, which outputs 'L' by the above total delay time (DT).

Figure 9:
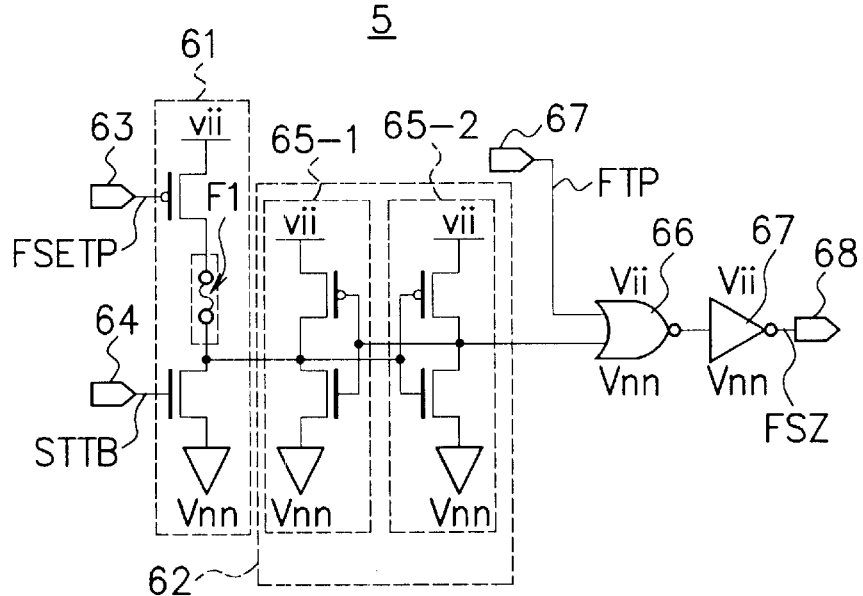
FIG. 9 is a diagram for showing a circuit constitutional example of a fuse information latch circuit 5.

FIG. 9 is a diagram for showing a circuit constitutional example of a fuse information latch circuit 5.

In FIG. 9, a reference numeral 61 denotes a circuit for outputting the fuse information to select whether the redundancy circuit is used or not. The circuit 61 is configured by one Pch-Tr, one Nch-Tr and a fuse F1 to select whether the redundancy circuit is used or not. The circuit 61 is connected between the power supply voltage Vii and the negative voltage Vnn in series in order of the Pch-Tr, the fuse F1 and the Nch-Tr. Additionally, a node between the fuse F1 and the Nch-Tr is connected to a latch circuit 62.

In the Pch-Tr of the circuit 61, the fuse set pulse signal FSETP is input through an input node 63. In the Nch-Tr of the circuit 61, the fuse starter signal STTB is input through an input node 64. As a result, while the fuse starter signal STTB is 'H', namely, before resetting, 'L' is output as a signal to be output to the latch circuit 62.

Then, the fuse starter signal STTB is changed from 'H' to 'L', and the fuse set pulse signal FSETP is changed from 'H' to 'L'. In this case, when the fuse F1 is not cut, i.e., when it is not redundant, a signal to be output to the latch circuit 62 becomes 'H', and when the fuse F1 is cut, i.e., when it is redundant, a signal to be output to the latch circuit 62 holds 'L'.

The latch circuit 62 comprises a circuit for latching a signal to be output from the above circuit 61. The latch circuit 62 is configured by two inverters 65-1 and 65-2. These two inverters are configured by one Pch-Tr and one Nch-Tr, respectively. An output of the inverter 65-2 is input in the inverter 65-1. Additionally, the output of the inverter 65-1 or the output of the circuit 61 its input in the inverter 65-2 and it is output to a NOR circuit 66. That is, the latch circuit 62 latches the signal input from the circuit 61. Then, the latch circuit 62 inverts a polarity thereof to output it to the NOR circuit 66.

A signal output from the above latch circuit 62 and a redundancy test signal FTP input through an input node 67 are input in the NOR circuit 66. The above redundancy test signal FTP comprises a test signal and it is 'L' in a normal state. A reference numeral 67 denotes an inverter. The inverter 67 inverts an output of the NOR circuit 66 and outputs it to an output node 68 for outputting the output signal FSZ.

As a result, when the fuse set pulse signal FSETP is changed from 'H' to 'L', in the case that the fuse F1 is cut, a signal to be output from the circuit 61 to the latch circuit 62 becomes 'L'. The latch circuit 62 latches this signal. And the latch circuit 62 inverts and outputs the signal to the NOR circuit 66. Accordingly, a signal to be output through the output node 68 becomes 'H'.

Further, when the fuse set pulse signal FSETP is turned from 'H' to 'L', in the case that the fuse F1 is not cut, a signal to be output from the circuit 61 to the latch circuit 62 becomes 'H'. The latch circuit 62 latches this signal. And the latch circuit 62 inverts and outputs the signal to the NOR circuit 66. Since the redundancy test signal FTP is 'L', a signal to be output through an output node 68 becomes 'L'.

Figure 10:
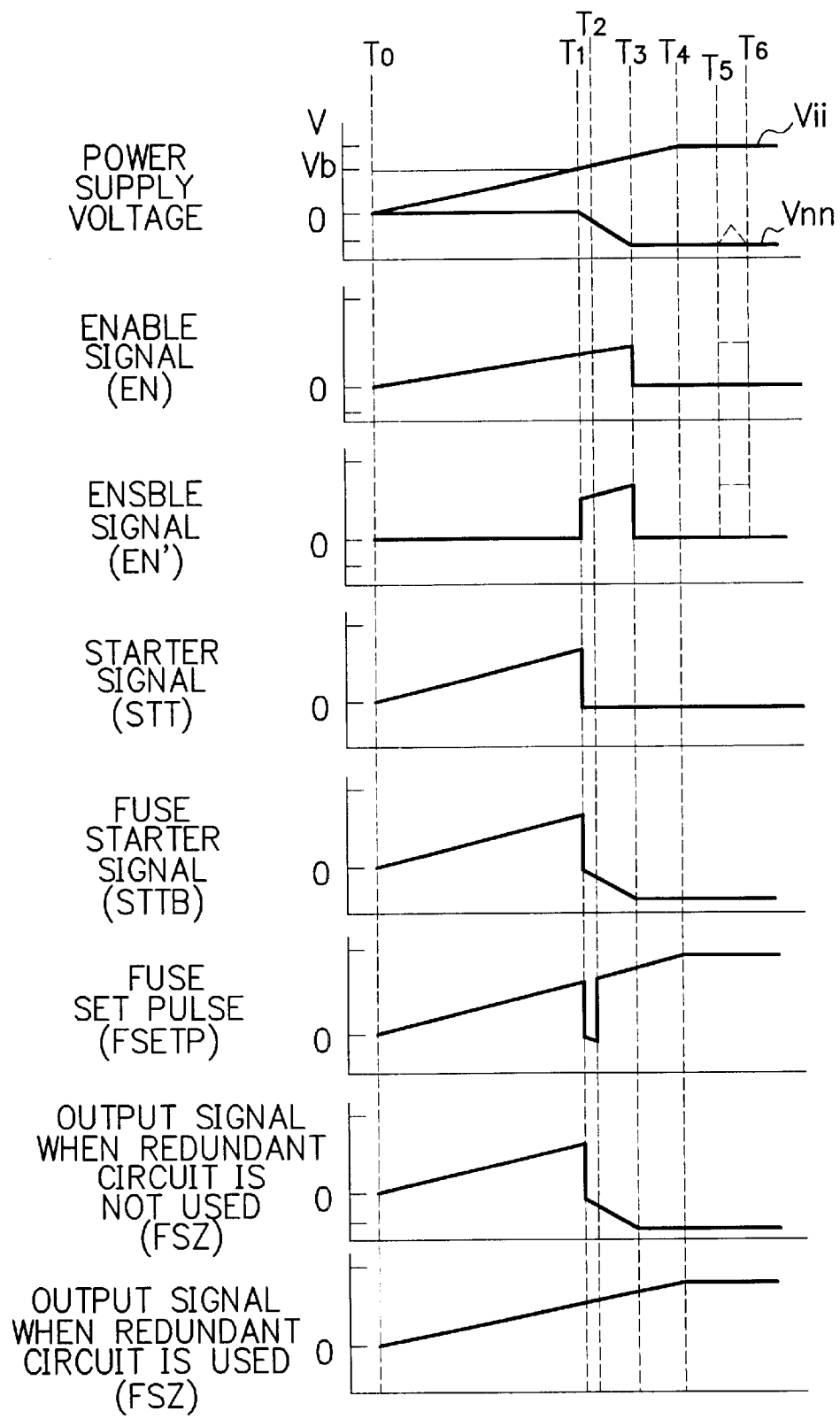
FIG. 10 is a timing chart for explaining an operation of a redundancy judgment circuit according to the first embodiment of the present invention.

FIG. 10 is a timing chart for explaining an operation of a redundancy judgment circuit according to the first embodiment shown in FIG. 4.

In the following explanation, the negative voltage Vnn is defined as the ground potential Vss until the negative voltage generation circuit 2 starts the operation of the negative voltage generation for the first time after the power supply is turned on.

In FIG. 10, if the power supply is turned on at the time of $T_0$, the power supply voltage Vii rises up. As the power supply voltage Vii rises up, the enable signal EN, the starter signal STT, the fuse starter signal STTB, the fuse set pulse signal FSETP and the output signal FSZ also rise up. These signals are rising monotonously until the time of $T_1$ when the voltage of the power supply voltage Vii reaches a predetermined potential Vb. At this time (from the time of $T_0$ to the time of $T_1$), a transfer gate in the switch circuit 36 shown in FIG. 6 is turned off by the starter signal STT, so that the enable signal EN' becomes the ground potential Vss, which is clamped by the Nch-Tr 38.

When the potential of the power supply voltage Vii reaches a predetermined potential Vb at the-time of $T_1$, the starter signal STT is reset to 'L' by the starter signal generation circuit 1. This allows the fuse starter signal STTB to be reset to 'L'.

Changing the fuse starter signal STTB from 'H' to 'L' allows the fuse set pulse signal FSETP to be output from the fuse set pulse generation circuit 4 to be 'L'. Thus, the fuse information latch circuit 5 latches the fuse information to select whether the redundant circuit is used or not to the latch circuit 62.

In this case, if the fuse F1 is not cut, i.e., if the redundant circuit is not used, 'H' is latched to the latch circuit 62 and 'L' is output as the output signal FSZ. On the other hand, if the fuse F1 is cut, i.e., if the redundant circuit is used, 'L' is latched to the latch circuit 62 and 'H' is output as the output signal FSZ.

Since the negative voltage generation circuit 2 does not start the negative voltage generation operation before this time of $T_1$, the low levels of the fuse starter signal STTB, the fuse set pulse signal FSETP and the output signal FSZ are the ground potential Vss.

The starter signal STT is 'L' at this time of $T_1$, so that the transfer gate in the switch circuit 36 shown in FIG. 6 is turned on. Thus, the enable signal EN is output to the oscillation and pumping circuit 33 as the enable signal EN' and the oscillation and pumping circuit 33 starts the negative voltage generation operation. Therefore, the low levels of the fuse starter signal STTB, the fuse set pulse signal FSETP and the output signal FSZ, of which low levels are the negative voltage Vnn are lowered after the time of $T_1$.

At the time of $T_2$, which shows that the total delay time (DT) of the delay lines 52-1 to 52-3 in the fuse set pulse generation circuit 4 shown in FIG. 8 passes since the time of $T_1$, the fuse set pulse signal FSETP to be output from the fuse set pulse generation circuit 4 becomes 'H'.

Assuming that the negative voltage judgment circuit 31 shown in FIG. 6 judges that the potential of the negative voltage Vnn reaches a predetermined potential at the time of $T_3$, the negative voltage judgment circuit 31 outputs this judgment result to the negative voltage generation enable circuit 32. Thus, the negative voltage generation enable circuit 32 changes the enable signal EN to 'L'. In accordance with this, the enable signal EN' also becomes 'L' and the oscillation and pumping circuit 33 does not perform the negative voltage generation operation, so that the potential of the negative voltage Vnn becomes constant.

At the time of $T_4$, the potential of the power supply voltage Vii is stabilized. After that, for example, the potential of the negative voltage Vnn is higher than a predetermined potential at a time of $T_5$, it is judged that the potential of the negative voltage Vnn is higher than a predetermined potential by the negative voltage judgment circuit 31. Then, this judgment result is output to the negative voltage generation enable circuit 32 and the negative voltage generation enable circuit 32 outputs the enable signal EN in 'H'. In accordance with this, the enable signal EN' also becomes 'H' and the negative voltage generation operation is started again by the oscillation and pumping circuit 33.

If the potential of the negative voltage Vnn is lower than a predetermined potential at a time of $T_6$, it is judged that the potential of the negative voltage Vnn is lower than a predetermined potential by the negative voltage judgment circuit 31. In accordance with this, the enable signal EN' also becomes 'L' and the oscillation and pumping circuit 33 does not perform the negative voltage generation operation, so that the potential of the negative voltage Vnn becomes constant.

As described above in detail, according to the present embodiment, during the starter signal STT, which rises up together with the power supply voltage Vii after the power supply is turned on, remains at 'H', the negative voltage generation circuit 2 does not perform the negative voltage generation operation. In this time of The potential of the negative voltage Vnn is clamped to the ground potential.

Then, if the potential of the power supply voltage Vii reaches a predetermined potential Vb, the starter signal generation circuit 1 resets the starter signal STT from 'H' to 'L'. In accordance with this, the fuse starter signal STTB to be output from the starter signal level shifter 3 is changed from 'H' to 'L'. This change allows the fuse set pulse signal FSETP, which is generated and output by the fuse set pulse generation circuit 4 remains 'L' at a predetermined period and the fuse information latch circuit 5 latches the fuse information.

The starter signal STT becomes 'L', so that the negative voltage generation circuit 2 starts the negative voltage generation operation and supplies the generated negative voltage Vnn to the starter signal level shifter 3, the fuse set pulse generation circuit 4 and the fuse information latch circuit 5.

Thus, when the starter signal STT is changed from 'H' to 'L', the low level of the starter signal level shifter 3 (Vnn) is the ground potential and it is not necessary for the starter signal level shifter 3 to shift the level. Therefore, even when the size ratio of the Pch-Tr and the Nch-Tr in the circuits 41 and 42 in the starter signal level shifter shown in FIG. 7 is smaller, the starter signal level shifter 3 is capable of changing the fuse starter signal STTB from 'H' to 'L' and outputting it. Further, after that, since the negative voltage Vnn generated by the negative voltage generation circuit 2 is supplied, the low level can be the potential of the negative voltage Vnn.

Consequently, even when the size ratio of the Pch-Tr and the Nch-Tr in the circuits 41 and 42 in the starter signal level shifter is smaller, the starter signal level shifter 3 is easily capable of shifting the low level from the ground potential to the potential of the negative voltage Vnn.

Additionally, after the latch circuit 5 latches the fuse information, the negative voltage Vnn generated by the negative voltage generation circuit 2 is supplied and the low level becomes the potential of the negative voltage Vnn. Therefore, even if a noise is loaded on the starter signal STT, it becomes difficult for the above noise to transmit to the fuse starter signal STTB, so that the fuse information of the fuse latch circuit 5 becomes strong against disturbance.

Then, the second embodiment of the present invention will be explained below.

Here, the entire construction of a redundancy judgment circuit of a word line of a memory or the like, which applies a semiconductor integrated circuit according to the second embodiment is the same as the redundancy judgment circuit shown in FIG. 4.

Figure 11:
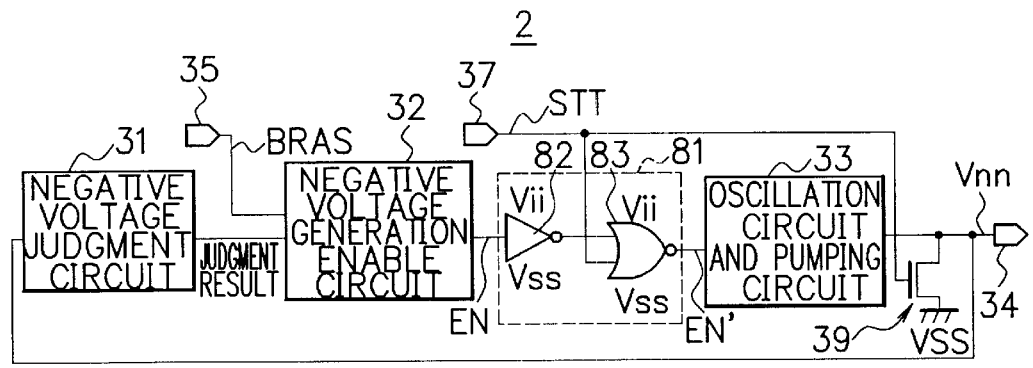
FIG. 11 is a diagram for showing a constitutional example of a negative voltage generation circuit 2 of a redundancy judgment circuit, which applies a semiconductor integrated circuit according to the second embodiment of the present invention.

FIG. 11 is a diagram for showing a constitutional example of a negative voltage generation circuit 2 of a redundancy judgment circuit, which applies a semiconductor integrated circuit according to the second embodiment of the present invention.

In FIG. 11, the same blocks shown in FIG. 6 are given by the same reference numerals and explanation thereof are omitted.

In FIG. 11, a reference numeral 81 denotes a gate circuit for outputting the enable signal EN to be input from the negative voltage generation enable circuit 32 to the oscillation and pumping circuit 33 on the basis of the starter signal STT to be input through the input node 37. The gate circuit 81 is configured by an inverter 82 and a NOR circuit 83. The inverter 82 inverts the polarity of the enable signal EN to be input from the negative voltage generation enable circuit 32 and outputs it. In the NOR circuit 83, the output of the above inverter 82 and the starter signal STT to be input through the input node 37 are input.

Thus, when the above starter signal STT is 'H', namely, before resetting, the enable signal EN' becomes 'L' regardless of the output from the inverter 82. On the other hand, when the above starter signal STT is 'L', namely, after resetting, the inverted output of the inverter 82 is output as the enable signal EN'. That is, the enable signal EN to be output from the negative voltage generation enable circuit 32 is output as the enable signal EN'.

Since the operation of a redundancy judgment circuit, which uses the negative voltage generation circuit 2 shown in FIG. 11, is the same as the operation by the redundancy judgment circuit of the first embodiment shown in FIG. 4, so that explanation thereof is omitted.

As described above, according to the second embodiment, by using the gate circuit 81 configured by one inverter 82 and one NOR circuit 83 in place of the switch circuit 36 of the negative voltage generation circuit 2 according to the first embodiment, the enable signal EN' is output to the oscillation and pumping circuit 33. Thus, it becomes possible to obtain the same effect as that of the first embodiment without clamping the input of the oscillation and pumping circuit 33.

In the above described first and second embodiments, the negative voltage Vnn is defined as the ground potential Vss until the negative voltage generation circuit 2 starts the operation of the negative voltage generation for the first time after the power supply is turned on. However, the negative voltage Vnn is not limited to the ground potential Vss but it may be a potential between the finally attained potential of the negative voltage Vnn and the ground potential Vss.

The above described first and second embodiments use the starter signal STT to be output from the starter signal generation circuit 1, which is defined positive before the potential of the power supply voltage Vii reaches a predetermined potential Vb (before resetting), and is defined negative after the potential of the power supply voltage Vii reaches a predetermined potential Vb (after resetting). However, a signal which is negative before resetting and is positive after resetting may also be used as the starter signal STT. In this case, before the starter signal STT is input in the negative voltage generation circuit 2 and the starter signal level shifter 3, if the starter signal STT is changed to a complementary signal by the inverter to be used, the starter signal STT performs the same operation as that in the first and the second embodiments.

Additionally, in the case that the first and the second embodiments are used as the redundancy judgment circuit of the word line of the memory, the negative voltage Vnn may be used as a resetting potential of the above word line of the memory.

Further, in the first and second embodiments, the switch circuit 36 or the gate circuit 81 is disposed between the negative voltage generation enable circuit 32 and the oscillation and pumping circuit 33 in the negative voltage generation circuit 2. However, without limiting to the place between the negative voltage generation enable circuit 32 and the oscillation and pumping circuit 33, disposing the switch circuit 36 shown in FIG. 12B or the gate circuit 81 shown in FIG. 12C at any place from (i) to (iii) shown in FIG. 12A, the same effect is capable of being obtained.

Figure 12A:
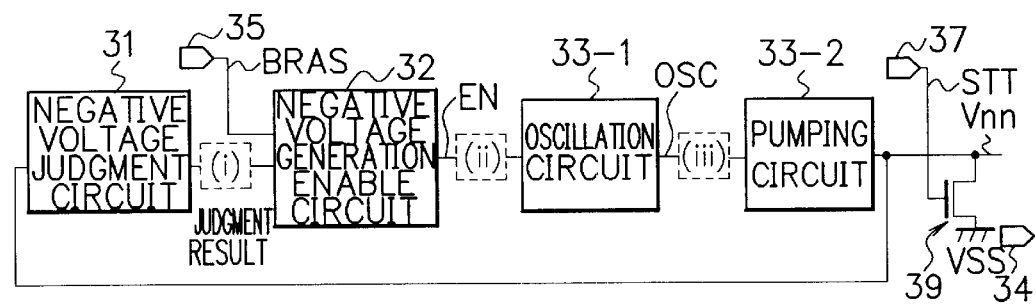
FIGS. 12A to 12E are diagrams for showing other circuit constitutional examples of the second embodiment of the present invention.
Figure 12B:
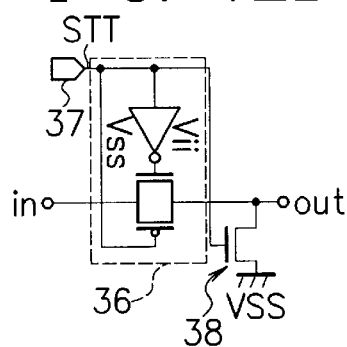
Figure 12C:
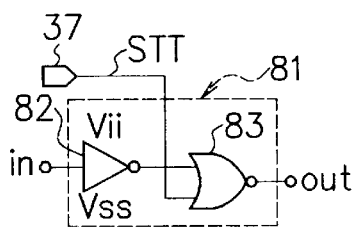

In FIG. 12A, a reference numeral 33-1 denotes an oscillation circuit in the oscillation and pumping circuit 33 and a reference numeral 33-2 denotes a pumping circuit in the oscillation and pumping circuit 33.

Figure 12D:
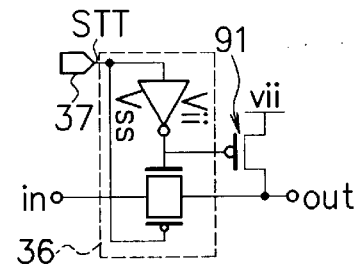
Figure 12E:
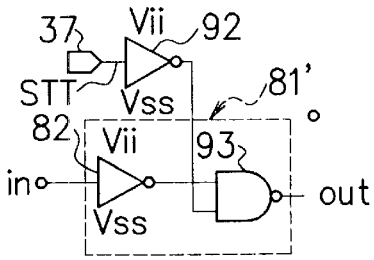

In the case that the negative voltage judgment circuit 31 outputs 'L' as a judgment result when the potential of the negative voltage Vnn is not lowered than a predetermined potential and it outputs 'H' when the potential of the negative voltage Vnn is lowered than a predetermined potential, in the switch circuit 36 or the gate circuit 81, the switch circuit 36 shown in FIG. 12D, or the gate circuit 81' shown in FIG. 12E may be disposed in a place (i) shown in FIG. 12A.

Additionally, in FIG. 12D, a reference numeral 91 denotes a Pch-Tr to prevent that the input of the negative voltage generation enable circuit 32 is floated when the starter signal is 'H' (before resetting). Thus, the input of the negative voltage generation enable circuit 32 is clamped to the power supply voltage Vii. Further, in FIG. 12E, a reference numeral 92 denotes an inverter to invert a polarity of the starter signal STT, a reference numeral 93 denotes a NAND circuit, in which the output of the inverter 82 and the output of the inverter 92 are input.

What is claimed is:

1. A semiconductor integrated circuit comprising:
    a latch circuit for latching therein predetermined information in an activation operation after said integrated circuit is powered on; and
    a voltage generation circuit having an input signal rising up together with a power supply voltage supplied after said integrated circuit is powered on, and becoming a low level when said power supply voltage reaches a predetermined potential, said voltage generation circuit not performing a voltage generation operation before said predetermined information is latched by said latch circuit, and performing said voltage generation operation after said predetermined information is latched by said latch circuit, on the basis of said input signal or its complementary signal.

2. The integrated circuit according to claim 1, wherein a negative potential is generated by said voltage generation operation of said voltage generation circuit.

3. A semiconductor integrated circuit comprising:
    a latch circuit for latching therein predetermined information in an activation operation after said integrated circuit is powered on; and
    a voltage generation circuit having an input signal having a low level shifted from a first potential to a second potential not more than said first potential, said voltage generation circuit generating, as said second potential, a voltage higher than a finally attained potential before said predetermined information is latched by said latch circuit, and generating said finally attained potential as said second potential after said predetermined information is latched by said latch circuit, on the basis of said input signal.

4. The integrated circuit according to claim 3, further comprising:
    a level shift circuit for shifting said low level of said input signal from said first potential to said second potential, wherein said latch circuit latches said predetermined information at a low level equal to said second potential, on the basis of said input signal whose low level has been shifted by said level shift circuit, and said finally attained potential is equal to the potential of said low level of said latch circuit in a normal operation.

5. The integrated circuit according to claim 3, wherein said voltage generation circuit comprises:
    a voltage output circuit for generating said second potential and outputting it;
    a judgment circuit for judging as to whether or not the potential generated and output by said voltage output circuit is equal to said second potential;
    a control circuit for outputting a control signal to control said voltage output circuit, on the basis of the result of judgment by said judgment circuit; and
    a switching circuit for determining that said control signal output from said control circuit is sent to said voltage output circuit or not.

6. The integrated circuit according to claim 5, wherein said switching circuit does not send said control signal to said voltage output circuit before said predetermined information is latched by said latch circuit, and said switching circuit sends said control signal to said voltage output circuit after said predetermined information is latched by said latch circuit.

7. The integrated circuit according to claim 5, wherein said switching circuit does not send said control signal to said voltage output circuit when a power supply voltage supplied after said integrated circuit is powered on is lower than a predetermined value, and said switching circuit sends said control signal to said voltage output circuit when said power supply voltage supplied is not less than said predetermined value.

8. The integrated circuit according to claim 5, wherein said switching circuit comprises a transfer gate made up from two transistors and an inverter, and
    said input signal is input to a gate of one of said transistors, and to a gate of the other of said transistors through said inverter.

9. The integrated circuit according to claim 5, wherein said switching circuit comprises an inverter and a NOR circuit, and
    said input signal is input to said NOR circuit, said control signal is input to said NOR circuit through said inverter, and an arithmetic operation result is output to said voltage output circuit.

10. The integrated circuit according to claim 5, wherein said voltage output circuit comprises an oscillation circuit and a pumping circuit, and
    said switching circuit is connected in series at one of nodes between said judgment circuit and said control circuit, between said control circuit and said oscillation circuit, and between said oscillation circuit and said pumping circuit.

11. The integrated circuit according to claim 3, wherein said second potential to be generated before said predetermined information is latched by said latch circuit is equal to said first potential.

12. The integrated circuit according to claim 3, wherein said first potential is equal to a ground potential.

13. The integrated circuit according to claim 12, wherein said input signal is a signal that rises up together with a power supply voltage supplied after said integrated circuit is powered on and becomes a low level when said power supply voltage reaches a predetermined potential, or its complementary signal.

14. The integrated circuit according to claim 12, wherein said second potential is used as a reset potential for a word line of a memory.

15. The integrated circuit according to claim 12, wherein said predetermined information is redundancy judgment information for a memory.

16. A method for controlling activation of a semiconductor integrated circuit including a latch circuit for latching predetermined information in an activation operation, said latch circuit having a low level after said activation operation as a finally attained potential, said method comprising:
    supplying a potential not more than a ground potential and higher than said finally attained potential, to said latch circuit as a negative potential, shifting a low level of an input signal from said ground potential to said negative potential, and outputting it, before said predetermined information is latched to said latch circuit; and
    supplying said finally attained potential as said negative potential after said predetermined information is latched to said latch circuit on the basis of the output signal.

17. The method according to claim 16, wherein said potential not more than said ground potential and higher than said finally attained potential is equal to said ground potential.

* * * * *